US009035627B2

(12) United States Patent
Herzog et al.

(10) Patent No.: US 9,035,627 B2
(45) Date of Patent: May 19, 2015

(54) SWITCHED MODE POWER SUPPLY EMPLOYING FIRST AND SECOND FEEDBACK SIGNALS AND A METHOD OF OPERATING THEREOF

(75) Inventors: Hans Herzog, Tampere (FI); Sami Sipilae, Tampere (FI); Nikolay Tchamov, Tampere (FI)

(73) Assignee: Intel Mobile Communications GmbH, Neubiberg (DE)

( * ) Notice: Subject to any disclaimer, the term of this patent is extended or adjusted under 35 U.S.C. 154(b) by 371 days.

(21) Appl. No.: 13/495,108

(22) Filed: Jun. 13, 2012

(65) Prior Publication Data

US 2013/0335048 A1    Dec. 19, 2013

(51) Int. Cl.
G05F 1/59 (2006.01)
H02M 3/158 (2006.01)
H03K 17/06 (2006.01)
H03K 17/10 (2006.01)
H02M 1/00 (2006.01)

(52) U.S. Cl.
CPC .... H02M 3/1588 (2013.01); H02M 2001/0054 (2013.01); H02M 2001/0058 (2013.01); H03K 17/063 (2013.01); H03K 17/102 (2013.01); Y02B 70/1466 (2013.01); Y02B 70/1491 (2013.01)

(58) Field of Classification Search
USPC .......................................... 323/271, 282, 351
See application file for complete search history.

(56) References Cited

U.S. PATENT DOCUMENTS

| 3,351,848 | A | 11/1967 | Lodder |
| 4,800,476 | A * | 1/1989 | Harada et al. ................... 363/16 |
| 5,592,367 | A | 1/1997 | Sugimori et al. |
| 6,215,290 | B1 | 4/2001 | Yang et al. |
| 6,249,156 | B1 | 6/2001 | Attwood |
| 6,304,065 | B1 | 10/2001 | Wittenbreder |
| 6,429,632 | B1 | 8/2002 | Forbes et al. |
| 6,819,088 | B2 | 11/2004 | Shenai et al. |
| RE40,907 | E | 9/2009 | Steigerwald et al. |
| 7,672,147 | B1 | 3/2010 | Schutten et al. |
| 7,791,905 | B2 | 9/2010 | Smet et al. |
| 7,839,667 | B2 | 11/2010 | Liao et al. |
| 8,030,909 | B2 * | 10/2011 | Ma et al. ........................ 323/271 |
| 8,063,671 | B2 | 11/2011 | Xiao |
| 8,212,537 | B2 | 7/2012 | Carpenter et al. |
| 8,248,047 | B2 * | 8/2012 | Zhou ............................. 323/271 |
| 8,369,109 | B2 | 2/2013 | Niedermeier et al. |
| 8,436,594 | B2 * | 5/2013 | Fu et al. ........................ 323/271 |
| 8,536,803 | B2 | 9/2013 | Sadwick et al. |
| 8,587,269 | B2 * | 11/2013 | Salato .......................... 323/271 |
| 2003/0234636 | A1 * | 12/2003 | Ruan et al. ................... 323/271 |
| 2004/0027101 | A1 | 2/2004 | Vinciarelli |
| 2004/0100805 | A1 | 5/2004 | Wei et al. |
| 2006/0012348 | A1 | 1/2006 | Zhao et al. |
| 2006/0091871 | A1 | 5/2006 | Abedinpour et al. |
| 2008/0012542 | A1 * | 1/2008 | Liu et al. ....................... 323/271 |
| 2008/0157691 | A1 | 7/2008 | Lu et al. |

(Continued)

OTHER PUBLICATIONS

Office Action Dated Mar. 28, 2014 U.S. Appl. No. 13/495,067.

(Continued)

*Primary Examiner* — Jeffrey Sterrett
(74) *Attorney, Agent, or Firm* — Eschweiler & Associates, LLC

(57) ABSTRACT

A switched mode power supply includes a first switch, a second switch, an inductor, an output capacitor, and a driving circuit for driving the first switch and the second switch. The driving circuit is electrically coupled to a node between the first and second switches.

22 Claims, 5 Drawing Sheets

(56) References Cited

U.S. PATENT DOCUMENTS

| | | |
|---|---|---|
| 2008/0180077 A1 | 7/2008 | Qiu et al. |
| 2010/0181970 A1 | 7/2010 | Yang et al. |
| 2010/0225287 A1 | 9/2010 | Schultz |
| 2010/0246231 A1 | 9/2010 | Sirio et al. |
| 2011/0204858 A1 | 8/2011 | Kudo |
| 2011/0316503 A1* | 12/2011 | Huang .................. 323/271 |
| 2012/0068675 A1* | 3/2012 | Kawagishi et al. .......... 323/271 |
| 2012/0068676 A1* | 3/2012 | Kawagishi et al. .......... 323/271 |
| 2012/0112715 A1* | 5/2012 | Tong et al. .................. 323/271 |
| 2012/0126777 A1 | 5/2012 | Motegi |
| 2012/0146600 A1* | 6/2012 | Xu et al. .................. 323/271 |
| 2012/0212196 A1* | 8/2012 | Ozasa .................. 323/271 |
| 2013/0280879 A1 | 10/2013 | Stecher et al. |
| 2013/0335048 A1* | 12/2013 | Herzog et al. .............. 323/283 |

OTHER PUBLICATIONS

U.S. Appl. No. 13/495,089, filed Jun. 13, 2012.

U.S. Appl. No. 13/495,067, filed Jun. 13, 2012.

P.C. Theron et al., "Soft Switching Self-Oscillating IGBT-Based DC-DC Converters", IEEE, 2002, pp. 929-935.

Hiroshi Sakamoto et al., "Self Oscillated PWM Converter with Imulse Resonant Soft-switching", IEEE, 2003, pp. 340-343.

C.F. Lee et al., "A Monolithic Current-Mode CMOS DC-DC Converter With On-Chip Current-Sensing Technique", IEEE, vol. 39, No. 1, pp. 3-14, 2004.

A. A. Fomani et al., "A Segmented Gate Driver with Adjustable Driving Capabilitiy for Efficiency Optimization", IEEE, 2010, pp. 1646-1650.

Jose F. da Rocha et al., "Level Shifters and DCVSL for a Low-Voltage CMOS 4.2-V Buck Converter", IEEE, 2008, pp. 3315-3323.

A. Stratakos et al., "High-Efficiency Low-Voltage DC-DC Conversion for Portable Applications", Wiley-IEEE Press, 1998, ch. 12, pp. 361-397.

In Hwan Oh, "A Soft-Switching Synchronous Buck Converter for Zero Voltage Switching (ZVS) in Light and Full Load Conditions", IEEE, pp. 1460-1464, 2008.

Ehsan Adib et al., "Zero-Voltage-Transition PWM Converters With Synchronous Rectifier", IEEE, vol. 23, No. 1, 2010, pp. 105-110.

Hong Mao et al., "Zero-Voltage-Switching DC-DC Converters With Synchronoius Rectifiers", IEEE, vol. 23, No. 1, 2008, pp. 369-378.

N. Lakshminarasamma et al., "A Family of Auxiliary Switch ZVS-PWM DC-DC Converters With Coupled Inductor", IEEE, vol. 22, No. 5, 2007,0 pp. 2008-2017.

K. I. Hwu et al., "Simple Design of a Soft-Switching Buck Converter", IEEE, 2008, pp. 410-414.

Yingqi Zhang et al., "A New Soft-Switching Technique for Buck, Boost, and Buck-Boost Converters", IEEE, vol. 39, No. 6, 2003, pp. 1775-1782.

Mehdi Alimadadi et al., "A 3GHz Switching DC-DC Vonverter Unsing Clock-Tree Charge-Recycling in 90nm CMOS with Integrated Output Filter", IEEE, 2007, pp. 532, 533, 620.

William A Peterson et al., "A Half Bridge, Self-Oscillating, Multi-Resonant Converter Circuit", IEEE, 1993, pp. 77-84.

Non-Final Office Action dated Nov. 10, 2013 for U.S. Appl. No. 13/495,067. 29 Pages.

Final Office Action Dated May 9, 2014 U.S. Appl. No. 13/495,089.

Non-Final Office Action dated Jan. 16, 2014 for U.S. Appl. No. 13/495,089. 44 Pages.

Non-Final Office Action dated Sep. 18, 2014 in connection with U.S. Appl. No. 13/495,067.

Notice of Allowance Dated Jan. 2, 2015 U.S. Appl. No. 13/495,067.

Final Office Action Dated Jan. 15, 2015 U.S. Appl. No. 13/495,089.

Non Final Office Action Dated Sep. 22, 2014 U.S. Appl. No. 13/495,089.

* cited by examiner

SWITCHED MODE POWER SUPPLY EMPLOYING FIRST AND SECOND FEEDBACK SIGNALS AND A METHOD OF OPERATING THEREOF

FIELD

The present invention relates to a switched mode power supply, a synchronous converter, and a method of operating a switched mode power supply.

BACKGROUND

Modern electric and electronic devices such as, for example, central processing units and other loads in the field of computing platforms, or modern lighting equipment such as fluorescent lamps, low-energy lamps, LEDs, etc. put increasing demands on their power supplies and voltage regulations, wherein power supplies and power converters are requested to operate with high frequencies. While there is a general desire for increased switching frequencies of power supplies, the increased frequencies may cause higher switching losses, lowering converter efficiency. Therefore there is a general need for minimizing switching losses in power supplies and power converters.

BRIEF DESCRIPTION OF THE DRAWINGS

The accompanying drawings are included to provide a further understanding of the disclosure and are incorporated in and constitute a part of this specification. The drawings illustrate embodiments and together with the description serve to explain principles of the disclosure. Other variations and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
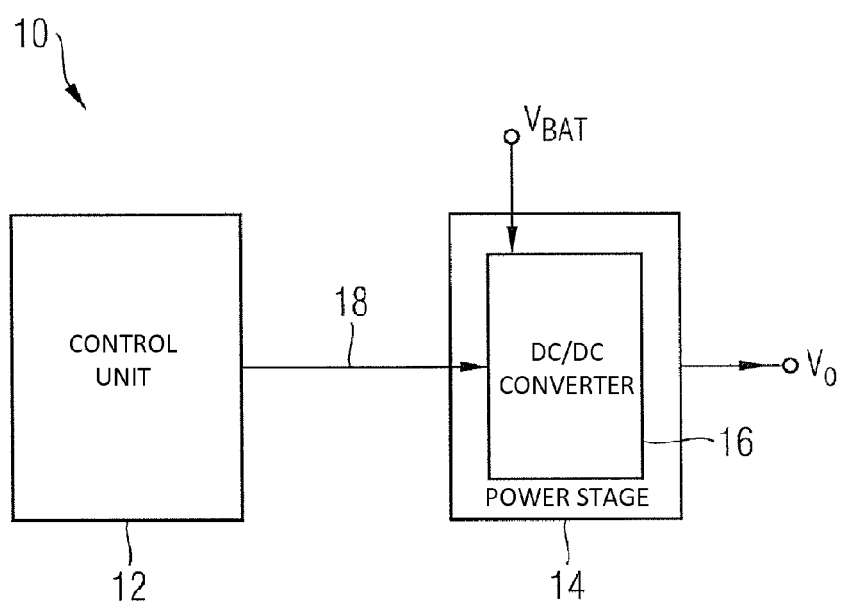
FIG. 1A is a block diagram schematically illustrating an embodiment of a device comprising a power supply.

In the following description, for purposes of explanation, various aspects and embodiments of the disclosure are described with reference to the drawings, wherein numerous specific details are set forth in order to provide a thorough understanding. It may be evident, however, to one skilled in the art that one or more aspects of the embodiments may be practiced with a lesser degree of the specific details. In other instances, known structures and elements are shown in schematic form in order to facilitate describing one or more aspects of the disclosure. It is to be understood that other embodiments may be utilized and structural or logical changes may be made without departing from the scope of the disclosure.

In the figures and the description like reference numerals are generally utilized to refer to like elements throughout. It is to be noted that the various elements and structures shown in the figures are not necessarily drawn to scale. Features and/or elements are illustrated with particular dimensions relative to each other primarily for sake of clarity and ease of understanding; as a consequence, relative dimensions in factual implementations may differ substantially from those illustrated herein.

In addition, features or aspects disclosed may be combined with one or more other features or aspects of other implementations as may be desired and advantageous for any given or particular application. The following detailed description is not to be taken in a limiting sense, and the scope of the present invention is intended to be defined solely by the appended claims.

The terms "coupled" and "connected", along with derivatives may be used herein. It should be understood that these terms may be used to indicate that two elements co-operate or interact with each other regardless whether or not they are in direct physical or electrical contact with each other.

In the following, disclosure is directed to a switched-mode power supply or similar power supply circuit, which may include realizations such as, for example, direct current to direct current (DC/DC) power converter circuits like buck converter circuits, boost converter circuits, or buck-boost converter circuits, alternate current to direct current (AC/DC) converter circuits, or direct current to alternate current (DC/AC) converter circuits.

Switches are referred to herein. A switch may, for example, be implemented as comprising one or more active and/or passive semiconductor elements. For example, a switch may be realized based on one transistor, or two transistors, or more transistors. Various embodiments of switches may comprise, for example, two transistors connected in a cascode configuration. Accordingly, the terms 'switch' and 'transistor' may sometimes be used synonymously herein to some degree.

Embodiments of a switch may comprise active elements other than transistors, and may comprise, for example, one or more diodes, combinations of active elements such as a combination of one or more transistors and one or more diodes, ICs (integrated circuits), semiconductor chips, etc. Additionally or alternatively, embodiments of a switch may comprise passive elements such as, for example, one or more resistors or similar resistive elements including, for example, frequency-dependent resistances.

Embodiments of a transistor may include, for example, a bipolar transistor, an NMOS (N-type Metal Oxide Semiconductor), PMOS (P-type Metal Oxide Semiconductor), and/or CMOS (Complementary Metal Oxide Semiconductor) transistor, etc. Various embodiments of a transistor comprise a power transistor, a CMOS power transistor, a high voltage (HV) transistor, etc.

Embodiments of a switched mode power supply, buck converter, DC/DC converter, synchronous converter, etc., may include a filter circuit, an LC circuit, etc., which may be referred to herein by a combination of an inductor and a capacitor. It is to be understood that the inductance and/or capacitance of a filter circuit, LC circuit, etc. may be implemented according to various embodiments in the form of one or more dedicated passive elements, such as one or more inductors and one or more capacitors. The aforementioned circuits may additionally or alternatively be implemented by providing a desired inductance and/or capacitance in an output circuitry of the converter for example by taking into account a parasitic inductance and/or parasitic capacitance.

According to one exemplary, non-limiting embodiment, an output circuit of a converter may comprise a dedicated passive element for providing a desired inductance, i.e. an inductor, while a desired capacitance is implemented by a parasitic capacitance in the output circuitry, i.e. no dedicated capacitor element is included. Nevertheless, also this example is intended to be encompassed when referring to a filter circuit, LC circuit, etc., herein illustrated and described as including a dedicated inductor and capacitor.

Inverters are referred to herein. According to various embodiments, an inverter may be implemented, for example, as a NOT gate. For instance, a CMOS inverter may comprise a p-type transistor and an n-type transistor as embodiments of MOSFET transistors. An enabled inverter as referred to herein may comprise an enabling gate to enable or disable the inverter for forwarding a signal therethrough. For example, the gate may be implemented by a switch. In case the enabling gate comprises a transistor, that transistor may be of a complementary type than the switching transistor driven by the driving circuit. For example, in case a CMOS power transistor implementing a power converter switch is of n-type, an enabling gate transistor may be of p-type, and vice versa.

According to various embodiments, inverter chains may be provided which comprise two or more inverters connected in series. Therefore, an inverter chain may comprise a first inverter for receiving an input signal such as, for example, a driving signal, and the inverter chain may comprise a last inverter for supplying an output signal such as, for example the driving signal or the inverted driving signal to, for example, a switch of a power converter. An inverter chain may comprise zero or more intermediate inverters connected between the first and the last inverter.

FIG. 1A is a block diagram schematically illustrating an embodiment 10 of a device implementing a power supply. The device 10 comprises a control unit 12 and a power stage 14. The power stage 14 may comprise a DC/DC converter 16 which may be operable, when controlled accordingly by the control unit 12, to convert a DC input voltage (battery voltage) $V_{BAT}$ into a DC output voltage $V_O$. The control unit 12 may control 18 the power stage 14 to achieve a desired output voltage $V_O$, for example by controlling a duty cycle of the DC/DC converter 16. The DC/DC converter 16 may be an implementation of at least one of, for example, a switched mode power supply, a buck converter, a synchronous converter, etc.

Figure 1B:
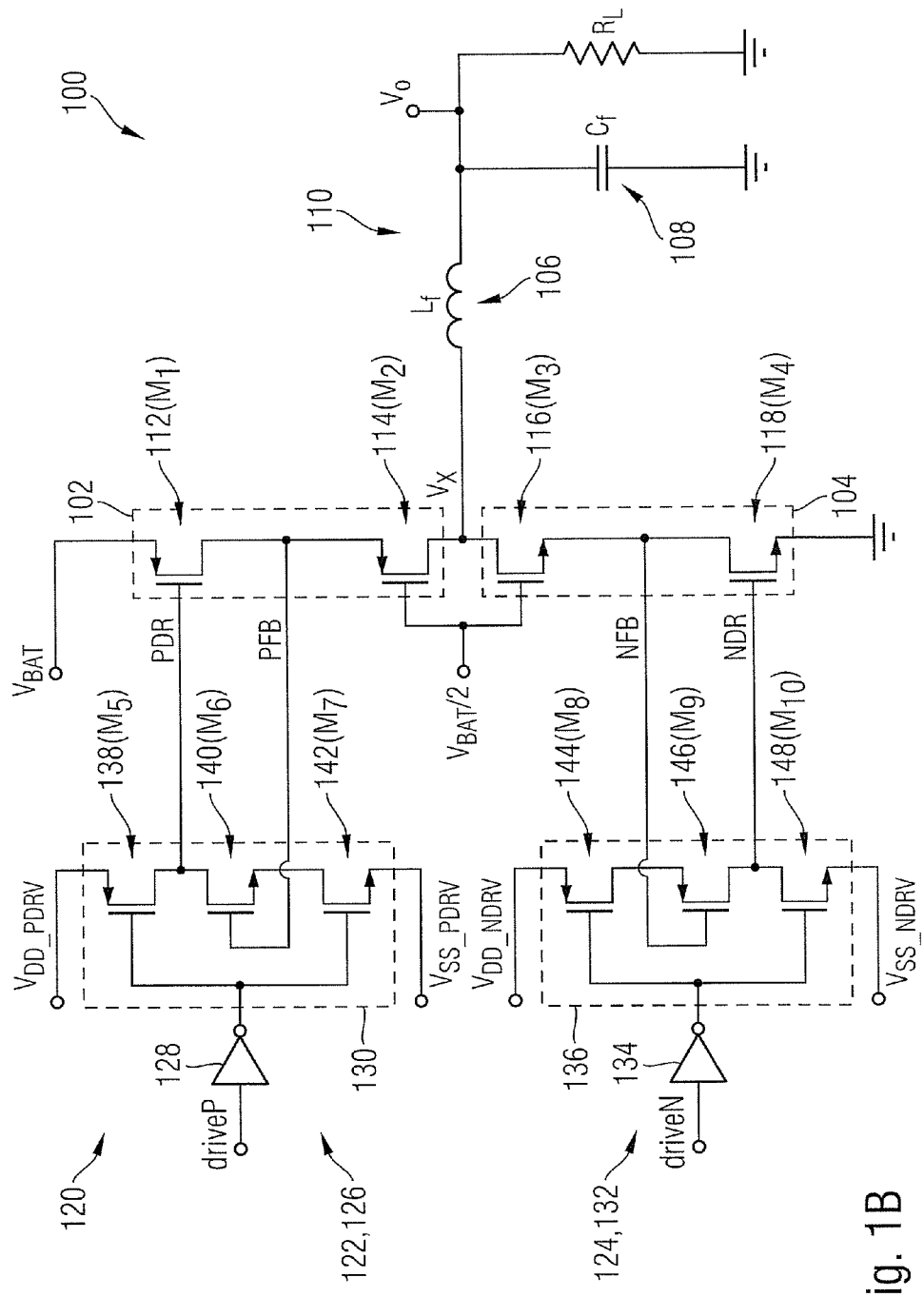
FIG. 1B is a circuit diagram illustrating an embodiment of a switched mode power supply.

FIG. 1B schematically illustrates a topology of an example 100 of a switched mode power supply, which may be operated as a DC/DC buck converter, such as DC/DC converter 16 in FIG. 1A. In general, the switched mode power supply can be fabricated by CMOS technology. The converter circuitry 100 comprises a first switch 102, a second switch 104, an inductor ($L_f$) 106, and an output capacitor ($C_f$) 108. The converter 100 may operate to convert an input voltage $V_{BAT}$ into an output voltage $V_O$ for a load resistance $R_L$. The inductance 106 and capacitance 108 implement a filter circuit 110 of the converter 100.

The switch 102 comprises a first transistor ($M_1$) 112 and a second transistor ($M_2$) 114, wherein $M_1$ and $M_2$ are connected in a cascode configuration in this example. The second switch 104 comprises a third transistor ($M_3$) 116 and a fourth transistor ($M_4$) 118 connected in a cascode configuration in this example. The switches 102, 104 are connected via a node $V_X$ with the LC circuit 110. The second transistor M2 and the third transistor M3 are provided for reducing the break-down problem due to the CMOS fabrication process. It should be added that each one of the second and third transistors can be replaced by two or more respective transistors for further enhancing the withstand voltage or further reducing the break-down problem.

The converter circuit 100 comprises a driving circuit 120 for driving the first switch 102 and second switch 104. The driving circuit 120 comprises a first circuit section 122 and a second circuit section 124, wherein the first circuit section 122 is connected with the first switch 102, i.e. transistor 112 thereof, while the second circuit section 124 is connected to the second switch 104, more precisely the transistor 118 thereof. The first circuit section 122 comprises as a first inverter circuit 126 an inverter chain including a first inverter 128 and a last inverter 130. The second circuit section 124 comprises as a second inverter circuit 132 an inverter chain including a first inverter 134 and a last inverter 136.

The inverter 130 may be implemented as an enabled inverter comprising three switches implemented as transistor 138 ($M_5$), transistor 140 ($M_6$), and transistor 142 ($M_7$), respectively. While the transistors 138 and 142 form a standard inverter, the transistor 140 operates as an enabling gate for the inverter 130. The inverter 136 may be implemented as an enabled inverter comprising three switches implemented as transistor 144 ($M_8$), transistor 146 ($M_9$), and transistor 148 ($M_{10}$), respectively. The transistors 144 and 148 form a standard inverter, while the transistor 146 operates as an enabling gate for the inverter 136.

First inverter 128 of first inverter chain 126 receives a driving signal driveP for driving the switch 102, while first inverter 134 of second inverter chain 132 receives a driving signal driveN for driving the switch 104. The last inverter 130 of first inverter chain 126 may provide the driving signal driveP to the switch 102, and may specifically provide the driving signal driveP to a gate of the transistor 112 via a node PDR, while the last inverter 136 of second inverter chain 132 may provide the driving signal driveN to the switch 104, and may specifically provide the driving signal driveN to a gate of the transistor 118 via a node NDR.

The enabling gate 140 of the enabled inverter 130 is connected to a node PFB of the switch 102 between transistors 112 and 114. Similarly, the enabling gate 146 of the enabled inverter 136 is connected to a node NFB between transistors 116 and 118 of the switch 104. In this way, a connection, which may be referred to as a feedback connection, can be established between the filter circuit 110 and each of the first 122 and second 124 sections of driving circuit 120. Other configurations may be considered, which, for example, may connect to node $V_X$.

In the example of FIG. 1B, the transistors $M_1$ to $M_4$ are implemented as power transistors. The power MOS transistors $M_1$ and $M_4$ can be switched on and off with the driving signals driveP and driveN whose duty cycle regulate the output voltage $V_O$ of the converter 100. The difference between the supply rails of the driving circuit sections 122 and 126 may be less than the breakdown voltages allowed for $M_1$ and $M_4$. The filtering inductor 106 and the output filtering capacitor 108 operate to provide, from the input voltage (battery voltage) $V_{BAT}$, the filtered output voltage $V_O$ downstream the inverter output voltage $V_X$.

The P driver 122 and the N driver 124 may receive and/or form the switching signals to be supplied to $M_1$ and $M_4$, respectively. The inverter chains 126 and 132 may be considered as tapered inverters for providing the respective driving signals to the switches $M_1$ and $M_4$. Enabling pulses for the enabled inverters 130 and 136 are taken from the nodes PFB and NFB, respectively. Specifically, the enabling pulses enable the inverter 130 and inverter 136 when the threshold voltages of $M_6$ and $M_9$, respectively, are traversed, for example, exceeded. As a result, a respective driving signal is then passed to the gates $M_1$ and $M_4$ via node PDR and NDR, respectively.

A converter may be operated according to a ZVS (Zero Voltage Switching) technique, for which it is required that a filtering inductor current may swing below zero, resulting in a filtering inductor operating as a current source. The current from the inductor may charge an inverter output node, which would increase towards an input voltage such as, e.g., a battery voltage ($V_{BAT}$). In case an inverter output voltage would equal the input voltage, and when a first switch ($M_1$) is switched on, a drain-source potential ($V_{DS}$) of the first switch ($M_1$) would be about zero (in general, there may be deviations from zero voltage due to a significant current flowing through non-zero on-resistances of power transistors). The time required to arrive at the inverter output node voltage should be synchronized with a dead time between a second switch turned off and the first switch turned on. In a similar way, a time required for discharging the inverter output node from the input voltage to zero should be equal to a dead time between the first switch turned off and the second switch turned on.

Figure 2:
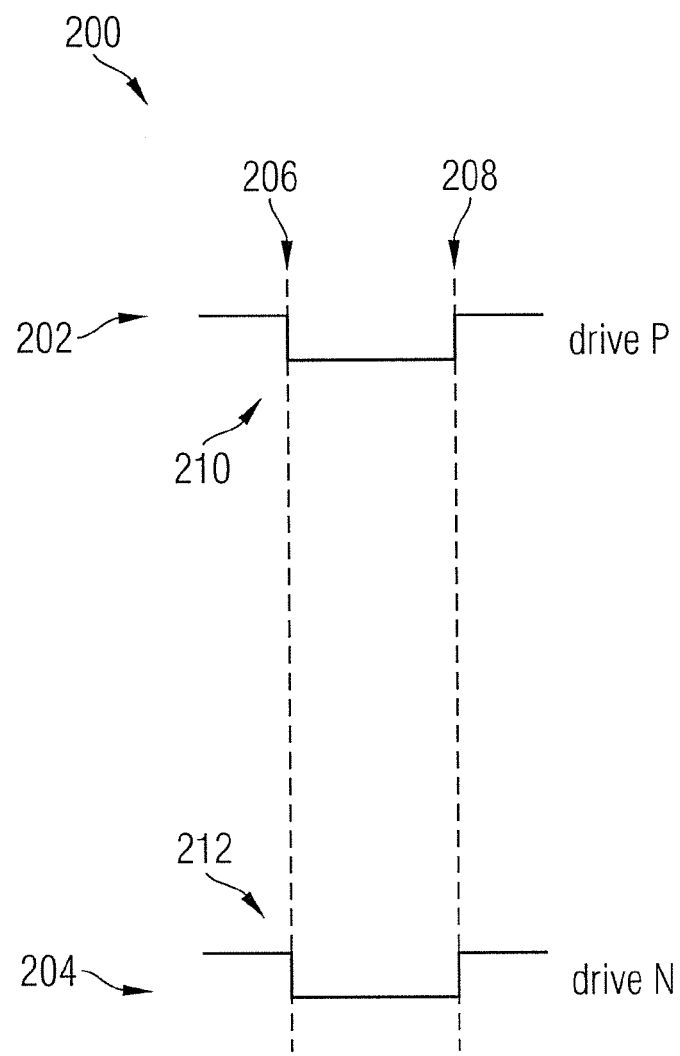
FIG. 2 is a timing diagram schematically illustrating driving signals supplied to the power supply of FIG. 1.

FIG. 2 schematically illustrates an exemplary signal diagram 200 of a combination of driving signals driveP 202 and driveN 204 in a form and phase as may be provided to the driving circuit sections 122 and 124, respectively. As illustrated, both signals 202 and 204 may comprise square wave signal forms and may be in phase, i.e. both signals may achieve a high-to-low state at one and the same point in time 206, and both signals may achieve a low-to-high state at one and the same point in time 208, i.e. no phase differences in the form of dead times, etc. and both signals 202 and 204 are in phase. It is to be understood that in case of an uneven number of inverters in the inverter chains of a driving circuit, the driving signals driveP and/or driveN would have to be inverted as compared to signals 202 and 204.

Figure 3B:
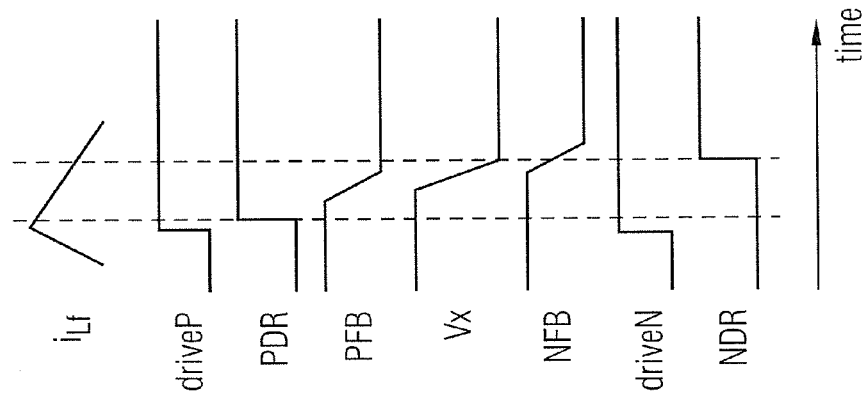
FIGS. 3A and 3B are timing diagrams illustrating various operational modes of the power converter of FIG. 1.
Figure 3A:
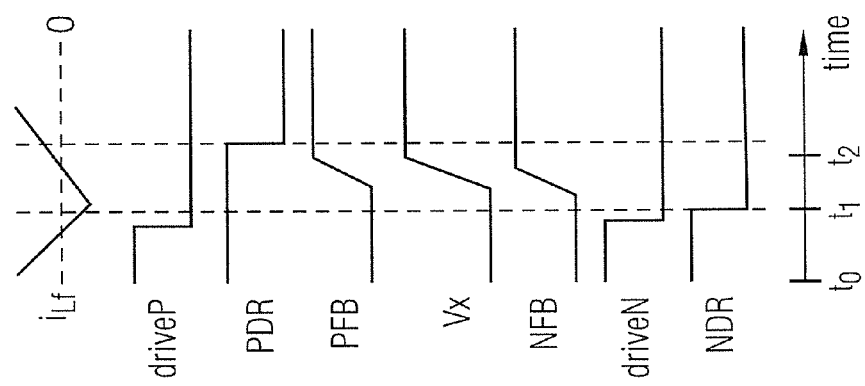

FIGS. 3A and 3B are timing diagrams illustrating an operation of the switched-mode power converter 100 of FIG. 1 at the high-to-low 206 and low-to-high 208 time-points of FIG. 2. As to the general configuration shown in FIG. 1, it is to be understood that the relative timing of the PDR and NDR signals influences switching losses of the switched-mode power supply 100. Short circuit paths between $V_{BAT}$ and ground have to be minimized, and therefore switching losses may be minimized by a proper driving of both transistors $M_1$ and $M_4$.

The switching losses can be minimized by driving the p-side transistor $M_1$ and n-side transistor $M_4$ such that both cannot conduct simultaneously. Consequently, when switching M1 on and M4 off, or when switching M1 off and M4 on, proper dead times would have to be generated accordingly. Deviations from optimum dead times may lead to increasing switching losses and decreasing converter 100 efficiency.

The driving pulses 210 and 212 illustrated in FIG. 2 may be modified by the driving circuit 120 of FIG. 1 before being applied via the nodes PDR and NDR to switches 102 and 104. Specifically, the driving pulses are synchronized by the local feedback signal supplied via nodes PFB and NFB to the driving circuit 120, wherein by means of the threshold voltage of enabling gates 140 and 146 the feedback is also digitized, as described in more detail below, to provide for desired dead times between the n- and p-type power transistors 112 and 118.

The synchronization may be based on a local feedback by the filtering inductor 106 current instead of, for example, a timing of the driving pulses 210 and 212 by external sources, and represents a self-synchronization mechanism. For that reason, for example, the phases of the input signals 202 and 204 can be varied with minimal effects on converter efficiency and are therefore not critical. For example, the input driving pulses can be in phase, as illustrated in FIG. 2 and may for example be derived from one and the same source. According to other aspects of the disclosure, there may be an offset between the phases of the driveP and driveN input signals, for example, there may be dead times between the low-to-high and/or high-to-low signal transitions of the two input signals.

Turning specifically to FIG. 3A, it is assumed for the sake of discussion that nodes $V_X$, PFB and NFB operate in a similar manner. For example, cascode transistors $M_2$ and $M_3$ may be biased in such a way that they conduct all the time. At a time $t_0$, signals at nodes PDR and NDR are high. As a result, switch $M_4$ is conducting, while switch $M_1$ is not conducting. Therefore, $V_X$ is low and the inductor 106 current $i_{LF}$ is decreasing toward a negative value. As the node NFB follows $V_X$, enabling gate $M_9$ conducts. Consequently, transistors $M_8$ and $M_{10}$ operate as a normal inverter.

At time $t_1$ in FIG. 3A corresponding to time-point 206 in FIG. 2, driving signal driveN changes state from high to low. As a result, NDR goes low, which turns transistor $M_4$ off. This prevents decreasing the inductor current $i_{LF}$ further, and the current is reversed and begins increasing toward a positive value. As there is no more pulldown for $M_4$, the inductor 106 current $i_{LF}$ is allowed to increase, which in turn starts to charge node $V_X$. As the voltage at $V_X$ increases, the voltages at nodes NFB and PFB also increase. At some point, NFB turns off the enabling transistor $M_9$. From then on, the node NDR is immune to changes in the input driving signal driveN.

At a time $t_2$, a voltage level at the node PFB reaches a threshold voltage of switch $M_6$. As a result, $M_6$ starts to conduct. Consequently, transistors $M_5$ and $M_7$ start to operate as a standard inverter. Accordingly, the input signal driveP, low at $t_2$, pulls the node PDR low. Therefore, the input voltage $V_{BAT}$ is supplied by switch $M_1$ to the filter circuit 110. In this way, a time delay between turning off $M_4$ at $t_1$ and turning on $M_1$ at $t_2$ can be generated. The delay is indicated in FIG. 3A with dashed lines. It is related to the inductor 106 current, and is not dependent on the details of the timing of the driving signals driveN and driveP.

FIG. 3B illustrates the operation of converter 100 at time 208 of FIG. 2 when signals driveP and driveN change state from low to high. The operation proceeds in an analogous way as has been described above for the low-to-high operation.

It is noted that there is no dead time control circuitry required upstream of the driving circuit 120 despite the driving signals driveP and driveN being supplied, for example, in phase to the converter 100 of FIG. 1. This is because the converter can adjust itself based on, for example, the feedback of the filtering inductor 106 current to the driving circuit 120. Due to self-adjustment, driving pulses may be generated in a relaxed manner with regard to timing requirements and may, for example, be generated in phase as illustrated with pulses 210 and 212 in FIG. 2.

According to various embodiments, providing a feedback connection from an inductor filter current to a driving circuit may require only a feedback conductor path and an additional transistor in case of a replacement of a standard inverter by an enabled inverter, such as in the example of FIG. 1 the transistors $M_6$ and $M_9$ for the feedback nodes PFB and NFB, respectively. No passive components may be required, which minimizes a silicon area. According to different aspects of the present disclosure, a logic as illustrated exemplarily in FIG. 1 may be implemented on a single chip, but does not need to be implemented as a DSP (Digital Signal Processor), as may be the case for example for other synchronization approaches requiring a massive number of transistors and/or other components.

In an exemplary, non-limiting realization of the topology of FIG. 1, the filtering inductor 106 size may be selected to be 11 Nanohenry (nH) with Qmax=30 at 120 MHz. The filtering capacitor 108 may have, for example, a capacitance of 2.4 Nanofarad with Q in the range of 500. The nominal size of the enabling transistor $M_6$ on the p-side may be selected, for example, in the range of 350 micrometer to 750 micrometer and may be, for example, about 550 micrometer. The nominal size of the enabling transistor $M_9$ on the n-side may be selected, for example, in the range of 275 micrometer to 675 micrometer, and may be, for example, about 475 micrometer. In general, it may be said that the capacitance value of the output capacitor and the inductance value of the filtering inductor depend on the switching frequency to be achieved. For a switching frequency of about 100 MHz, for example, the capacitance value can be in a range from 0.5 to 1.5 nF, for example, and the inductance value can be in a range from 10 to 30 nH.

For a battery voltage $V_{BAT}$ of, for example, 3.6 volt and output voltages $V_O$, for example, in the range of 1.4 volt to 2.0 volt, and switching frequencies in the range of 120 Megahertz, relative delay times for the driving signals driveP and driveN from high-to-low and/or low-to-high may be chosen between 0 (i.e. in-phase) and 400 picoseconds.

Figure 4:
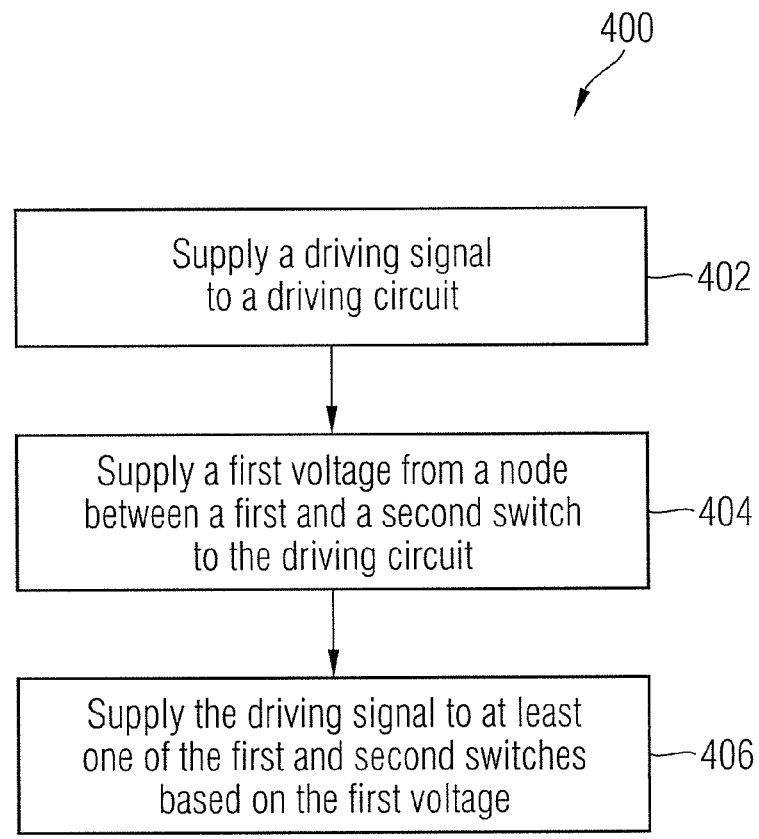
FIG. 4 is a flow diagram illustrating an embodiment of a method of operating a switched mode power supply.

FIG. 4 illustrates an embodiment 400 of a method of operating a switched mode power supply. The power supply may comprise a first switch, a second switch, an inductor, an output capacitor, and a driving circuit. While method 400 is shown as comprising a particular sequence of steps 402 to 406, according to other embodiments the sequence of steps may be changed, and/or two or more steps may be performed in parallel to each other. Additional steps may be performed, and/or other steps may replace one or more of the steps 402 to 406.

In step 402 a driving signal is supplied by an external control unit to the driving circuit. According to various embodiments, a first driving signal may be supplied to the driving circuit, which is intended for driving the first switch, and a second driving signal may be supplied to the driving circuit, which is intended for driving the second switch. The first driving signal and the second driving signal may have one and the same phase, or may have phase differences for one or both of a low-to-high signaling and a high-to-low signaling. According to one aspect, a single driving signal is provided to or generated by the driving circuit and is duplicated into a first and a second in-phase driving signal for driving the first and second switches, respectively.

In step 404 a first voltage is supplied via a node between the first and second switches to the driving circuit. For example, the node may be coupled directly or indirectly, for example via one or more switches, to the inductor, which may operate as a current source. The first voltage may be supplied to an enabling inverter in the driving circuit. In step 406 the driving signal is supplied to at least one of the first and second switches based on the first voltage supplied to the driving circuit. According to various embodiments, the driving signal may be supplied to at least one of the first and second switches when the first voltage traverses a threshold voltage of a transistor in the driving circuit. The first voltage may, for example, traverse a threshold voltage of an enabling gate of an enabling inverter in the driving circuit.

While the invention has been illustrated and described with respect to one or more implementations, modifications may be made to the illustrated examples without departing from the spirit and scope of the appended claims. With particular regard to the various functions performed by the above described components or structures (assemblies, devices, circuits, systems, etc.), the terms (including a reference to "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A switched mode power supply, comprising:
a first switch, a second switch, an inductor, and an output capacitor, wherein the first switch and the second switch are coupled together via a node, the inductor is coupled between the node and an output terminal, and the output capacitor is coupled to the output terminal;
a third switch and a fourth switch, wherein the third switch is coupled between the first switch at a first node and the node, and the fourth switch is coupled between the second switch at a second node and the node; and
a driving circuit configured to drive the first switch and the second switch, the driving circuit being electrically coupled to the node between the first and second switches,
wherein the driving circuit is electrically coupled to the first node between the first switch and the third switch and to the second node between the second switch and the fourth switch.

2. The switched mode power supply of claim 1, wherein the switched mode power supply being is on a single chip.

3. The switched mode power supply of claim 1, wherein the driving circuit further comprises a first circuit section and a second circuit section, the first circuit section being electrically coupled to the first switch and the second circuit section being electrically coupled to the second switch.

4. The switched mode power supply of claim 3, wherein the first circuit section comprises a first inverter circuit and the second circuit section comprises a second inverter circuit, wherein the first inverter circuit is electrically coupled to the first switch and the second inverter circuit is electrically coupled to the second switch.

5. The switched mode power supply of claim 4, wherein:
the first inverter circuit comprises at least a first inverter and a second inverter, wherein the first inverter is configured to receive a first driving signal and the second inverter is electrically coupled to the first node; and
the second inverter circuit comprises at least a third inverter and a fourth inverter, wherein the third inverter is configured to receive a second driving signal and the fourth inverter is electrically coupled to the second node.

6. The switched mode power supply of claim 4, wherein the first inverter circuit comprises a first enabled inverter and the second inverter circuit comprises a second enabled inverter.

7. The switched mode power supply of claim 6, wherein:
the first inverter circuit comprises a first inverter chain, wherein the first enabled inverter is a last inverter in the first inverter chain; and
the second inverter circuit comprises a second inverter chain, wherein the second enabled inverter is a last inverter in the second inverter chain.

8. The switched mode power supply of claim 6, wherein the first enabled inverter is connected to the first node and the second enabled inverter is connected to the second node.

9. The switched mode power supply of claim 6, wherein:
the first enabled inverter comprises a fifth switch, sixth switch and seventh switch, the fifth switch and the seventh switch being electrically coupled as an inverter and the sixth switch being electrically coupled as an enabling gate for the inverter of the fifth switch an the seventh switch; and
the second enabled inverter comprises an eighth switch, ninth switch and tenth switch, the eighth switch and the tenth switch being electrically coupled as an inverter and the ninth switch being electrically coupled as an enabling gate for the inverter of the eigth switch and the tenth switch.

10. The switched mode power supply of claim 9, wherein:
the sixth switch is electrically coupled to the first node; and
the ninth switch is electrically coupled to the second node.

11. The switched mode power supply of claim 9, wherein:
the first switch comprises a first transistor and the sixth switch comprises a sixth transistor, wherein the first transistor is of a different type than the sixth transistor; and
the second switch comprises a second transistor and the ninth switch comprises a ninth transistor, wherein the second transistor is of a different type than the ninth transistor.

12. The switched mode power supply of claim 11, wherein:
the sixth transistor comprises a first gate connected to the first node; and
the ninth transistor comprises a second gate connected to the second node.

13. The switched mode power supply of claim 11, wherein:
the sixth transistor comprises a source or a drain electrically coupled to the first switch; and
the ninth transistor comprises a source or a drain electrically coupled to the second switch.

14. The switched mode power supply of claim 1, wherein:
the first switch comprises a first CMOS power transistor; and
the second switch comprises a second CMOS power transistor.

15. A synchronous converter, comprising:
a first switch, a second switch, an inductor, and an output capacitor, wherein the first switch and the second switch are coupled together via a node, the inductor is coupled between the node and an output terminal, and the output capacitor is coupled to the output terminal; and
a driving circuit configured to drive the first switch and the second switch based on a first feedback signal and a second feedback signal, respectively, that are a function of a current in the inductor, wherein the driving circuit comprises a first enabled inverter and a second enabled inverter that receives the first and second feedback signals, respectively, and wherein the first enabled inverter and the second enabled are configured to enable operation of the driving circuit to drive the first and second switches, respectively.

16. The synchronous converter of claim 15, wherein the first switch comprises a first power transistor and the second switch comprises a second power transistor, wherein the first enabled inverter is electrically coupled to a gate of the first power transistor and the second enabled inverter is electrically coupled to a gate of the second power transistor.

17. The synchronous converter of claim 15, further comprising a third switch coupled between the first switch and the node and coupled to the first switch at a first node, and a fourth switch coupled between the second switch and the node and coupled to the second switch at a second node, wherein the first node feeds back the first feedback signal to the first enabled inverter, and wherein the second node feeds back the second feedback signal to the second enabled inverter.

18. The synchronous converter of claim 17, wherein:
the first enabled inverter comprises an enabling gate electrically coupled to the first node; and
the second enabled inverter comprises an enabling gate electrically coupled to the second node.

19. A method of operating a switched mode power supply comprising:
providing a first switch, a second switch, an inductor and an output capacitor, wherein the first and second switch are coupled with a node therebetween, and the inductor is coupled to the node, and the inductor and output capacitor operate together as a filter;
supplying first and second driving signals to a driving circuit that operates to drive the first switch and the second switch, respectively;
supplying a first feedback signal and a second, different feedback signal associated with the node between the first switch and the second switch to the driving circuit; and
supplying the first and second driving signals to the first switch and the second switch, respectively, based on the first and second feedback signals, respectively, supplied to the driving circuit.

20. The method of claim 19, further comprising:
supplying the first driving signal for the first switch and the second driving signal for the second switch to the driving circuit, wherein the first driving signal and the second driving signal have one and the same phase.

21. The method of claim 19, further comprising:
supplying the first and second feedback signals to first and second enabling inverters in the driving circuit.

22. The method of claim 19, further comprising:
supplying the first and second driving signals to at least one of the first switch and the second switch when the first and second feedback signals traverse a threshold voltage of a transistor in the driving circuit.

* * * * *